United States Patent
Hsu

(10) Patent No.: US 8,487,700 B2
(45) Date of Patent: Jul. 16, 2013

(54) PRE-DRIVER AND DIGITAL TRANSMITTER USING THE SAME

(75) Inventor: Jer-Hao Hsu, Hsinchu County (TW)

(73) Assignee: Novatek Microelectronics Corp., Hsinchu (TW)

(*) Notice: Subject to any disclaimer, the term of this patent is extended or adjusted under 35 U.S.C. 154(b) by 0 days.

(21) Appl. No.: 13/221,383

(22) Filed: Aug. 30, 2011

(65) Prior Publication Data

US 2012/0049960 A1 Mar. 1, 2012

(30) Foreign Application Priority Data

Aug. 31, 2010 (TW) .............................. 99129354 A

(51) Int. Cl.
*H03F 3/45* (2006.01)
(52) U.S. Cl.
USPC ......................................... 330/258
(58) Field of Classification Search
USPC .................... 330/251, 253, 258, 261
See application file for complete search history.

(56) References Cited

U.S. PATENT DOCUMENTS

| | | | |
|---|---|---|---|
| 6,356,141 B1 * | 3/2002 | Yamauchi | 327/543 |
| 6,570,931 B1 | 5/2003 | Song | |
| 6,590,422 B1 * | 7/2003 | Dillon | 330/253 |
| 6,731,135 B2 * | 5/2004 | Brunolli | 326/83 |
| 7,012,450 B1 * | 3/2006 | Oner et al. | 326/86 |
| 7,026,848 B2 | 4/2006 | Wang et al. | |
| 7,183,804 B2 * | 2/2007 | Icking et al. | 330/253 |
| 7,301,371 B2 | 11/2007 | Kim | |

* cited by examiner

*Primary Examiner* — Khanh V Nguyen
(74) *Attorney, Agent, or Firm* — Rabin & Berdo, P.C.

(57) ABSTRACT

A pre-driver includes first to fourth transistors and first and second impedance elements. The first transistor, coupled between the first output terminal and a first node, has a gate coupled to the first differential input terminal. The second transistor, coupled between the second differential output terminal and the first node, has a gate coupled to the second differential input terminal. The third transistor, coupled between the first differential output terminal and a second node, has a gate coupled to the first differential input terminal. The fourth transistor, coupled between the second differential output terminal and the second node, has a gate coupled to the second differential input terminal. The first and second impedance elements are coupled between the first differential output terminal and a third node, and coupled between the second differential output terminal and the third node, respectively, wherein the third node is biased to a preset voltage.

26 Claims, 3 Drawing Sheets

PRE-DRIVER AND DIGITAL TRANSMITTER USING THE SAME

This application claims the benefit of Taiwan application Serial No. 99129354, filed Aug. 31, 2010, the subject matter of which is incorporated herein by reference.

BACKGROUND OF THE INVENTION

1. Field of the Invention

The invention relates in general to a pre-driver, and more particularly to a pre-driver having a stable output common mode voltage and a stable output swing.

2. Description of the Related Art

Conventionally, a pre-driver has been applied to the high speed digital data transmission technology, and has been widely applied to various occasions, including, for example, a SerDes. Generally, the pre-driver provides a stable input common mode voltage level, which enabling the high speed transmitter operating in conjunction with the pre-driver to have better output signal quality.

In the prior art, however, the pre-driver often encounters a trade-off situation, in which the operation speed and the slew rate cannot be simultaneously satisfied due to an excessively-large swing of the output signal. In addition, the slew rates are different during the rising and falling periods of the output signal. Moreover, the pre-driver have other problems such as an unstable common mode voltage level and high sensitivity to power noise. As a result, the signal quality of the high speed transmitter is adversely affected.

Thus, it is an important direction in the industry to design a pre-driver capable of effectively providing coordinated parameters, such as output signal swings, operation speed and slew rate while having a better control of common mode voltage and slew rate.

SUMMARY OF THE INVENTION

The invention is directed to a pre-driver, which can advantageously have the stable output common mode voltage level, the restricted output signal swing, the symmetrical up and down slew rates, and the coordinated operation speeds and slew rates.

According to a first aspect of the present invention, a pre-driver for driving a transmitter is provided. The pre-driver includes first to fourth transistors and first and second impedance elements. The first transistor, electrically connected between a first differential output terminal and a first node, has a gate electrically connected to a first differential input terminal. The second transistor, electrically connected between a second differential output terminal and the first node, has a gate electrically connected to a second differential input terminal. The third transistor, electrically connected between the first differential output terminal and a second node, has a gate electrically connected to the first differential input terminal. The fourth transistor, electrically connected between the second differential output terminal and the second node, has a gate electrically connected to the second differential input terminal. The first impedance element is electrically connected between the first differential output terminal and a third node. The second impedance element is electrically connected between the second differential output terminal and the third node, wherein the third node is biased to a preset voltage.

According to a second aspect of the present invention, a transmission circuit is provided. The transmission circuit includes the above-mentioned pre-driver and a transmitter, which is electrically connected to the pre-driver, and generates a differential output signal in response to a differential input signal and generates an output driving signal in response to the differential output signal, respectively.

According to a third aspect of the present invention, a pre-driver, which can be used to drive a transmitter, is provided. The pre-driver includes first to fourth current paths, and first and second impedance elements. The first current path, electrically connected between a first differential output terminal and a first node, turns on or off in response to a first differential input signal. The second current path, electrically connected between a second differential output terminal and the first node, turns on or off in response to a second differential input signal. The third current path, electrically connected between the first differential output terminal and a second node, turns on or off in response to the first differential input signal. The fourth current path, electrically connected between the second differential output terminal and the second node, turns on or off in response to the second differential input signal. The first impedance element is electrically connected between the first differential output terminal and a third node. The second impedance element is electrically connected between the second differential output terminal and the third node, wherein the third node is biased to a preset voltage.

According to a fourth aspect of the present invention, a transmission circuit is provided. The transmission circuit includes the above-mentioned pre-driver and a transmitter, which is electrically connected to the pre-driver, and generates a differential output signal in response to a differential input signal and generates an output driving signal in response to the differential output signal, respectively.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
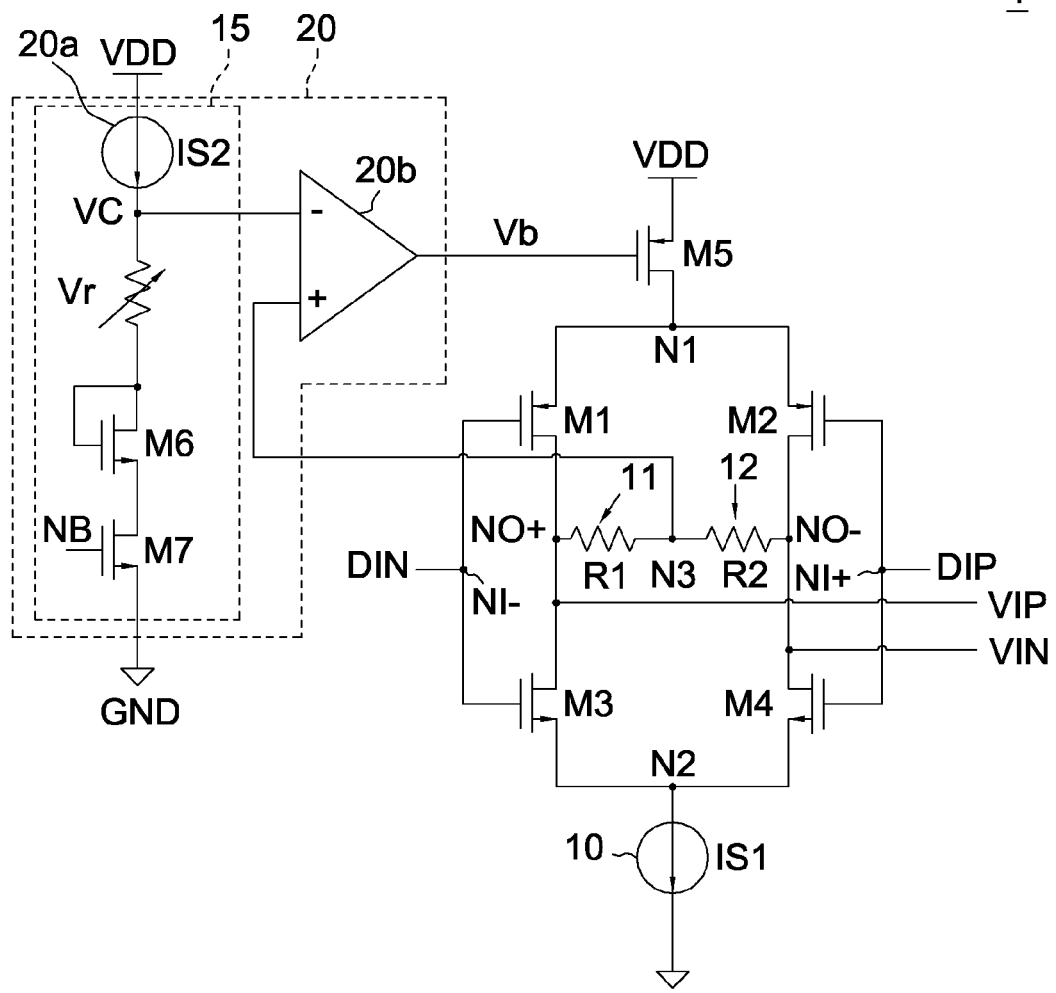
FIG. 1 is a schematic circuit diagram showing a pre-driver according to an embodiment.

FIG. 1 is a schematic circuit diagram showing a pre-driver 1 according to an embodiment. Referring to FIG. 1, the pre-driver 1 can generate a differential output signal in response to a differential input signal. The differential input signal includes a non-inverting input signal component DIP and an inverting input signal component DIN, which are respectively received by a non-inverting input terminal NI+ and an inverting input terminal NI−. The differential output signal includes a non-inverting output signal component VIP and an inverting output signal component VIN, which are respectively outputted from a non-inverting output terminal NO+ and an inverting output terminal NO−.

Referring to FIG. 1, the pre-driver 1 may include a first transistor M1 and a third transistor M3 serially connected to each other, and a second transistor M2 and a fourth transistor M4 serially connected to each other. The first and second transistors M1 and M2 are first type (e.g., P-type) transistors, while the second and fourth transistors M2 and M4 are second type (e.g., N-type) transistors. The first and third transistors M1 and M3 are respectively electrically connected between the non-inverting output terminal NO+ and a node N1, and electrically connected between the non-inverting output terminal NO+ and a node N2, and have gates electrically connected to the inverting input terminal NI−. Similarly, the second and fourth transistors M2 and M4 are respectively electrically connected between the inverting output terminal NO− and the node N1, and electrically connected between the inverting output terminal NO− and the node N2, and have gates electrically connected to the non-inverting input terminal NI+.

In addition, the pre-driver 1 may further include a first impedance element 11 and a second impedance element 12. The first impedance element 11 is electrically connected between the non-inverting output terminal NO+ and a node N3, while the second impedance element 12 is electrically connected between the inverting output terminal NO− and the node N3. The first and second impedance elements 11 and 12 are preferably implemented as passive loads, such as the resistor elements R1 and R2 shown in the drawing. In the following detailed description, in order to obtain good quality of the differential output signals (e.g., the output signal components DIP and DIN), the first impedance element 11 and the second impedance element 12 may be preferably configured to have the same impedance value.

In addition, the pre-driver 1 may further include a bias current source 10, which is electrically connected between the node N2 and a reference voltage (e.g., ground) and for providing an operation current IS1.

In addition, the pre-driver 1 may further include a bias circuit 20, which is electrically connected to the node N3 and biases the node N3 to a preset voltage. In the preferred embodiment, in which the first and second impedances have the same impedance values, the preset voltage may be configured to be equal to the desired common mode voltage level VCOM of the differential output signal, that is, (VIP+VIN)/2.

In addition, the pre-driver 1 may also include an active load, such as a fifth transistor M5, which may be electrically connected between a voltage source VDD and the node N1, and provide a current to the first to fourth transistors M1 to M4, wherein the current may be changed according to an output voltage Vb outputted from the bias circuit 20. Preferably, the output voltage Vb may be set such that the steady state current provided by the fifth transistor M5 is equal to the operation current IS1. In other embodiments, it is to be noted that the bias current source 10 and the bias circuit 20 may be respectively disposed outside the pre-driver 1.

FIG. 1 also shows an embodiment of the detailed circuit of the bias circuit 20. Referring to FIG. 1, the bias circuit 20 may include an operational amplifier 20b and an operation voltage generating circuit 15. The operational amplifier 20b has an input terminal (e.g., an inverting input terminal), which is electrically connected to the operation voltage generating circuit 15 to receive an operation voltage VC, and has another input terminal (e.g., a non-inverting input terminal), which is electrically connected to the node N3 to bias the node N3. A virtual short exists between the non-inverting input terminal and the inverting input terminal, so the voltage level of the non-inverting input terminal of the operational amplifier 20b may be substantially equal to the voltage level of the inverting input terminal (i.e., the level of the operation voltage VC outputted from the operation voltage generating circuit 15). As a result, the node N3 may be biased to the level of the operation voltage VC.

The operation voltage generating circuit 15 is configured to generate the operation voltage VC provided to the operational amplifier 20b. As mentioned hereinabove, in the preferred embodiment where the first and second impedances 11 and 12 have the same impedance value, the level of the operation voltage VC may be configured to be equal to the common mode voltage level VCOM of the differential output signal. FIG. 1 also shows a preferred embodiment of the detailed structure of the operation voltage generating circuit 15. As shown in FIG. 1, the operation voltage generating circuit 15 may include a variable resistor Rv, sixth and seventh transistors M6 and M7, a current source 20a and the operational amplifier 20b. The current source 20a provides a current IS2, which flows through the variable resistor Rv and the sixth and seventh transistors M6 and M7 (the gate of the seventh transistor M7 may be electrically connected to a bias voltage NB) for determination of the level of the operation voltage VC. The variable resistor Rv is an optional element adjustable according to different factors such as process offset or design requirements, such that the operation voltage VC reaches the desired level.

It is to be noted that the operation voltage generating circuit 15 may be designed to match the transmitter used in conjunction with the pre-driver 1, so that the optimum performance is obtained. For example, the transistors M6 and M7 of this embodiment are NMOS transistors, which are similar to (i.e., match) the NMOS transistor side of the embodiment of the transmitter of FIG. 2, can overcome fluctuations caused by process, temperature and power sources, and are particularly adapted to the condition where the common mode voltage level (i.e., (VOP+VON)/2) of the output driving signal of the transmitter approaches the zero (i.e., ground) level. Similarly, it can be analogized that in a case where the common mode voltage level of the output driving signal of the transmitter approaches the level of the voltage source VDD, the design of the operation voltage generating circuit 15 may adopt a PMOS transistor combination similar to the PMOS transistor side of the transmitter.

In addition, the operational amplifier 20b may also provide an output voltage Vb, which is electrically connected to a control terminal of the active load (the gate of the transistor M5 in this embodiment) to form a feedback path to stabilize the voltage level of the node N3. In detail, if the level of the node N3 fluctuates due to factors such as the environment interference, then the level of the output voltage Vb also fluctuates therewith to adjust the current provided from the transistor M5 and the voltage level of the node N3. As a result, the node N3 may be stabilized at the level of the operation voltage VC.

When the non-inverting and inverting input signal components DIP and DIN of the differential input signal are respectively switched to a high signal level and a low signal level, the second transistor M2 and the third transistor M3 are in the OFF state, while the first transistor M1 and the fourth transistor M4 are in the ON state. Consequently, the transistors M5, M1 and M4 and the bias current source 10 form a current path, such that the operation current IS1 can sequentially flow through the node N1, the non-inverting output terminal NO+, the resistor element R1, the node N3, the passive load R2, the inverting output terminal NO− and the node N2. As a result, the signal components VIP and VIN of the differential output signal are respectively switched to the high signal level and the low signal level, and have the values substantially equal to (R1×IS1) and (R2×IS1) with respect to the stably biased level of the node N3.

On the contrary, when the non-inverting and inverting signal components DIP and DIN of the differential input signal are respectively switched to the low signal level and the high signal level, the second transistor M2 and the third transistor M3 are in the ON state, while the first transistor M1 and the fourth transistor M4 are in the OFF state. Consequently, the transistors M5, M2 and M3 and the bias current source 10 form a current path, such that the operation current IS1 can sequentially flow through the node N1, the inverting output terminal NO−, the passive load R2, the node N3, the resistor element R1, the non-inverting output terminal NO+ and the node N2. As a result, the signal components VIP and VIN of the differential output signal may be respectively switched to the low signal level and the high signal level, and respectively have the values substantially equal to (R1×IS1) and (R2×IS1) with respect to the stably biased level of the node N3.

Figure 2:
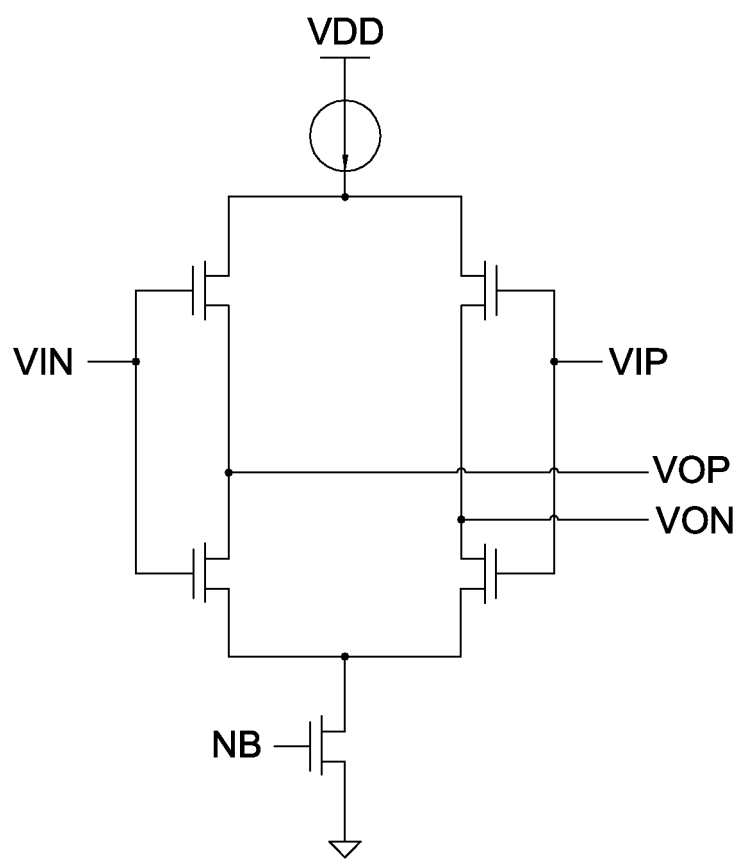
FIG. 2 is a schematic circuit diagram showing a transmitter used in conjunction with a pre-driver 1 according to an embodiment.

FIG. 2 is a schematic circuit diagram showing a transmitter 2 used in conjunction with the pre-driver 1 of FIG. 1 according to an exemplary embodiment. In this exemplary embodiment, the pre-driver 1 provides the differential output signal to the transmitter 2 so as to drive the transmitter 2 to generate an output driving signal, which may have the non-inverting signal component VOP and the inverting signal component VON. It is to be noted that the transmitter 2 and the operation voltage generating circuit 15 may receive the same bias voltage NB to determine its operation current. It is noted that the transmitter of FIG. 2 only serves as an exemplary embodiment, and there are various transmitters that can be used in conjunction with the pre-driver of FIG. 1.

In the following, it is described that the differential output signal, outputted from the pre-driver 1 of FIG. 1, has excellent signal properties in various aspects, and thus can satisfy various requirements of driving the transmitter.

Stable Swing

Figure 3:
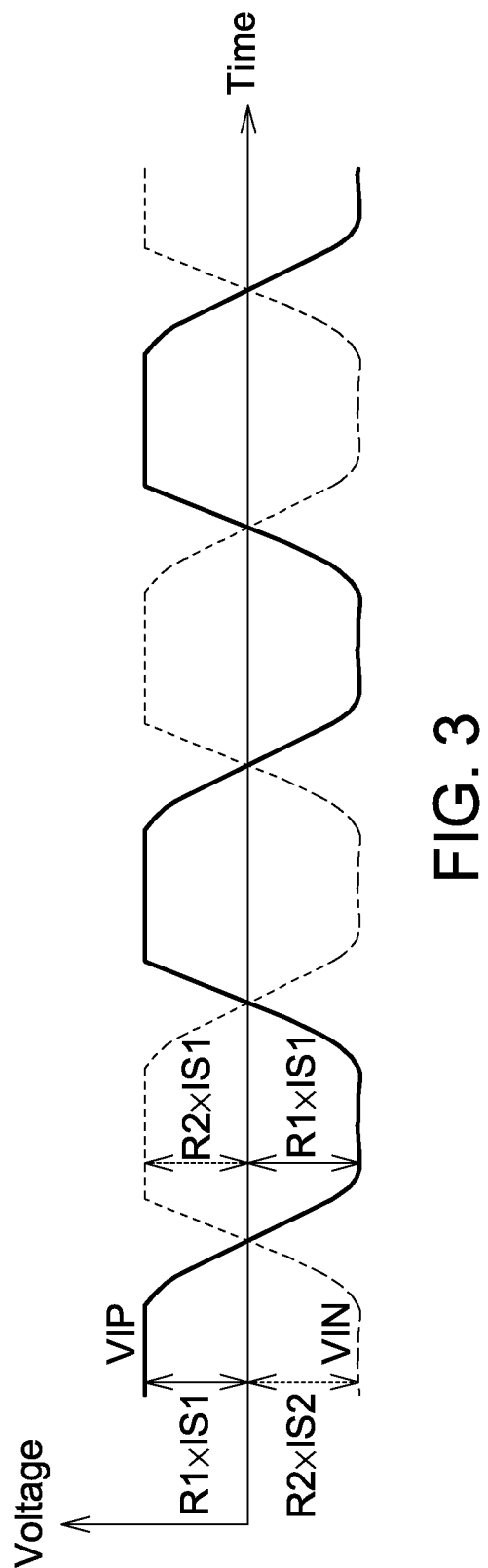
FIG. 3 is a waveform chart showing a differential output signal in FIG. 1 according to an embodiment.

FIG. 3 is a waveform chart showing the non-inverting and inverting signal components VIP and VIN of the differential output signal in FIG. 1 according to an embodiment. According to the above-mentioned operations, the pre-driver 1 in this embodiment of FIG. 1 can provide the swing substantially stabilized as the differential output signal of IS1×(R1+R2).

Stable Common Mode Voltage Level

In addition, the differential output signal may further have the stable common mode voltage level VCOM under the symmetrical and matched circuit structure.

More specifically, the impedance of the first impedance element 11 and the impedance of the second impedance element 12 may be designed to be substantially equal to each other (i.e., R1=R2 in this embodiment) under the preferred condition. Under the more preferred condition, the first and second transistors M1 and M2 may be designed to match each other, and the third and fourth transistors M3 and M4 may be designed to match each other. According to the operations, the node N is stably biased to the voltage level VC, the high and low signal levels of either the non-inverting or inverting output signal component VIP or VIN can be substantially equal to R1×IS1=R2×IS1 with respect to the stable bias voltage VC of the node N3. In brief, the common mode voltage level VCOM of the differential output signal can be stabilized at the desired voltage level VC.

The Same Up and Down Slew Rates

In addition, the slew rates of the level rising and level falling of the differential output signal can be substantially the same under the symmetrical and matched circuit structures.

In one preferred embodiment, the charge path and the discharge path of each of the non-inverting output terminal NO+ and the inverting input terminal NO− are symmetrical to each other. In other words, the level-rising driving circuit (i.e., the transistor M1 in the embodiment of FIG. 1) and the level-falling driving circuit (i.e., the transistor M3) of the non-inverting output terminal NO+ may be configured to have symmetrical circuit structures and circuit impedances. Similarly, the level-rising driving circuit (i.e., the transistor M2) and the level-falling driving circuit (i.e., the transistor M4) of the inverting output terminal NO− may be designed to have symmetrical circuit structures and circuit impedances.

Accordingly, the level-rising time and the level-falling time of each of the non-inverting output signal component VIP and the inverting output signal component VIN may be substantially equal to each other. In brief, the slew rates during the level-rising period and the level-falling period of the differential output signal may be substantially the same. Associatively, the common mode voltage level of the differential output signal can be stabilized during the rising and falling periods.

High-Speed Operation, Low Electromagnetic Interference and Low Coupling Capacity The swing of the differential output signal of the pre-driver 1 is restricted by IS1×(R1+R2), that is, the charge or discharge level is equal to only IS1×(R1+R2). So, compared with the conventional pre-driver with normally unsatisfying slew rate and the operation speed, the pre-driver 1 can advantageously achieve a low slew rate and a high operation speed. In addition, due to the low slew rate, the electromagnetic interference (EMI) effect may also be reduced. Furthermore, because the swing of the differential output signal is restricted by IS1×(R1+R2), the coupling capacity between the differential input signal (DIP and DIN) and the output driving signal (VOP and VON) can be reduced, so that the jitter of the output driving signal is improved to have the stable common mode voltage level, for example.

It is to be noted that the main spirit of the embodiment of FIG. 1 resides in that a voltage dividing circuit, composed of a first impedance 11 and a second impedance 12, is disposed between the non-inverting and inverting differential output nodes NO+ and NO−, such that the swing of the differential output signal can be stabilized at IS1(R1+R2). In addition, using a bias circuit to stably bias the node N3 to a preset voltage can stabilize the common mode voltage level of the differential output signal. Thus, this spirit can be implemented with various modifications.

For example, in the embodiment of FIG. 1, the first and second transistors M1 and M2 function as the first and second charge current paths, while the third and fourth transistors M3 and M4 function as the first and second discharge current paths. When DIN is low and DIP is high, the first charge current path and the second discharge current path concurrently turn on, while the second charge current path and the first discharge current path concurrently turn off, and the current IS1 can flow from the node N1 to the node N2 through the first charge current path, the first impedance 11, the node N3, the second impedance 12 and the second discharge current path, so that the level of the non-inverting differential output NO+ is increased and the level of the inverting differential output NO− is decreased. On the contrary, when DIN is high and DIP is low, the first charge current path and the second discharge current path concurrently turn off, while the second charge current path and the first discharge current path concurrently turn on, and the current IS1 can flow from the node N1 to the node N2 through the second charge current path, the second impedance 12, the node N3, the first impedance 11 and the first discharge current path, so that the level of the non-inverting differential output NO+ is decreased and the level of the inverting differential output NO− is increased.

Thus, the invention does not intend to restrict the detailed structures of the first and second charge current paths and the first and second discharge current paths. In other embodiments, the first and second charge current paths and the first and second discharge current paths can be respectively implemented according to design requirements by adopting different numbers and connections of transistors in conjunction with other circuit elements.

In addition, it is to be noted that the resistor elements 11 and 12 are used in the exemplary embodiment. However, the first and second impedance elements 11 and 12 may be implemented using various circuit elements. For example, in other embodiments, the resistor element can be replaced with a capacitor, a constantly-biased transistor, and the like.

In addition, it is also to be noted that, the active load serves as the fifth transistor M5 in the exemplary embodiment. In other embodiments, however, the active load can be implemented by various circuit elements and combinations thereof as long as one feedback path can be formed to stabilize the level of the node N3.

In addition, it is also to be noted that the bias circuit 20 and the operation voltage generating circuit 15 of FIG. 1 only serve as the exemplary embodiment, and there are various conventional circuits can be adopted to bias the node N3 and generate the operation voltage VC.

In addition, it is also to be noted that the MOS transistors are described in the circuit architecture of each of FIGS. 1 and 2. In other embodiments, for example, the MOS transistors may be replaced with bipolar transistors.

To sum up, the pre-driver of the embodiment includes the first and second impedances, each of which is coupled between a node and one of the non-inverting output terminal and the inverting output terminal, wherein the node is stably biased to a common mode voltage level through the bias circuit. The pre-driver of the embodiment further includes first to fourth transistors, which function as the current paths selectively turned on or off, so as to provide the constant operation current sequentially flowing through the non-inverting and inverting output terminals, or sequentially flowing through the inverting and non-inverting output terminals, to respectively provide different states of differential output signals.

Compared with the conventional pre-driver, which often encounters the trade off of design and thus cannot satisfy all the requirements of driving the transmitter, the pre-driver of the embodiment can advantageously have stable output of the common mode voltage level and swing, and good operation speed and slew rate, thus achieving better performance in driving the transmitter.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pre-driver for driving a transmitter having a first transmitter terminal and a second transmitter terminal, the pre-driver comprising:
    a first transistor, which is electrically connected between a first differential output terminal and a first node, and has a gate electrically connected to a first differential input terminal;
    a second transistor, which is electrically connected between a second differential output terminal and the first node, and has a gate electrically connected to a second differential input terminal;
    a third transistor, which is electrically connected between the first differential output terminal and a second node, and has a gate electrically connected to the first differential input terminal;
    a fourth transistor, which is electrically connected between the second differential output terminal and the second node, and has a gate electrically connected to the second differential input terminal;
    a first impedance element electrically connected between the first differential output terminal and a third node; and
    a second impedance element electrically connected between the second differential output terminal and the third node, wherein the third node is biased to a preset voltage;
    wherein the first and second differential output terminals respectively drive the first and second transmitter terminals.

2. The pre-driver according to claim 1, further comprising a bias circuit, which is electrically connected to the third node and for biasing the third node to the preset voltage.

3. The pre-driver according to claim 1, wherein an impedance of the first impedance element is substantially equal to an impedance of the second impedance element.

4. The pre-driver according to claim 1, wherein the preset voltage is substantially equal to a common mode voltage level of a signal level of the first differential output terminal and a signal level of the second differential output terminal.

5. The pre-driver according to claim 2, further comprising an active load having a control terminal, wherein the bias circuit further provides an output voltage to the control terminal of the active load.

6. The pre-driver according to claim 2, wherein the bias circuit comprises:
    an operation voltage generating circuit for generating an operation voltage; and
    an operational amplifier having an input terminal for receiving the operation voltage, and another input terminal electrically connected to the third node.

7. The pre-driver according to claim 1, wherein each of the first and second impedances is a passive load.

8. The pre-driver according to claim 1, wherein when the first and second differential input terminals are respectively at first and second levels, the first and fourth transistors turn on and the second and third transistors turn off, and when the first and second differential input terminals are respectively at the second and first levels, the first and fourth transistors turn off and the second and third transistors turn on.

9. A transmission circuit, comprising:
    the pre-driver according to claim 1, the pre-driver generating a differential output signal in response to a differential input signal; and
    the transmitter driven by the pre-driver, the transmitter being electrically connected to the pre-driver and for generating an output driving signal in response to the differential output signal.

10. The transmission circuit according to claim 9, wherein the transmitter comprises:
    a first transmit transistor, which is electrically connected between a third differential output terminal and a fourth node, and has a gate electrically connected to the first transmitter terminal;
    a second transmit transistor, which is electrically connected between a fourth differential output terminal and the fourth node, and has a gate electrically connected to the second transmitter terminal;

a third transmit transistor, which is electrically connected between the third differential output terminal and a fifth node, and has a gate electrically connected to the first transmitter terminal; and a fourth transmit transistor, which is electrically connected between the fourth differential output terminal and the fifth node, and has a gate electrically connected to the second transmitter terminal.

11. The transmission circuit according to claim 10, wherein the transmitter further comprises a current source electrically connected to the fourth node.

12. The transmission circuit according to claim 10, wherein the transmitter further comprises an active load electrically connecting to the fifth node.

13. The transmission circuit according to claim 10, wherein the first and second transmit transistors of the transmitter match the first and second transistors of the pre-driver.

14. The transmission circuit according to claim 10, wherein the third and fourth transmit transistors of the transmitter match the third and fourth transistors of the pre-driver.

15. A pre-driver for driving a transmitter having a first transmitter terminal and a second transmitter terminal, the pre-driver comprising:

a first current path, which is electrically connected between a first differential output terminal and a first node, and turns on or off in response to a first differential input signal;

a second current path, which is electrically connected between a second differential output terminal and the first node, and turns on or off in response to a second differential input signal;

a third current path, which is electrically connected between the first differential output terminal and a second node, and turns on or off in response to the first differential input signal;

a fourth current path, which is electrically connected between the second differential output terminal and the second node, and turns on or off in response to the second differential input signal;

a first impedance element electrically connected between the first differential output terminal and a third node; and a second impedance element electrically connected between the second differential output terminal and the third node, wherein the third node is biased to a preset voltage;

wherein the first and second differential output terminals respectively drive the first and second transmitter terminals.

16. The pre-driver according to claim 15, further comprising a bias circuit, which is electrically connected to the third node and for biasing the third node to the preset voltage.

17. The pre-driver according to claim 15, wherein when the first and second differential input terminals are respectively at first and second levels, the first and fourth current paths turn on and the second and third current paths turn off, and when the first and second differential input terminals are respectively at the second and first levels, the first and fourth current paths turn off and the second and third current paths turn on.

18. The pre-driver according to claim 15, wherein an impedance of the first impedance element is substantially equal to an impedance of the second impedance element.

19. The pre-driver according to claim 15, wherein the preset voltage is substantially equal to a common mode voltage level of a signal level of the first differential output terminal and a signal level of the second differential output terminal.

20. The pre-driver according to claim 16, further comprising an active load having a control terminal, wherein the bias circuit further provides an output voltage to the control terminal of the active load.

21. A transmission circuit, comprising:

the pre-driver according to claim 15, the pre-driver generating a differential output signal in response to a differential input signal; and the transmitter driven by the pre-driver, electrically connected to the pre-driver and for generating an output driving signal in response to the differential output signal.

22. The transmission circuit according to claim 21, wherein the transmitter comprises:

a first transmit transistor, which is electrically connected between a third differential output terminal and a fourth node, and has a gate electrically connected to the first transmitter terminal;

a second transmit transistor, which is electrically connected between a fourth differential output terminal and the fourth node, and has a gate electrically connected to the second transmitter terminal;

a third transmit transistor, which is electrically connected between the third differential output terminal and a fifth node, and has a gate electrically connected to the first transmitter terminal; and a fourth transmit transistor, which is electrically connected between the fourth differential output terminal and the fifth node, and has a gate electrically connected to the second transmitter terminal.

23. The transmission circuit according to claim 22, wherein the transmitter further comprises a current source electrically connected to the fourth node.

24. The transmission circuit according to claim 22, wherein the transmitter further comprises an active load electrically connecting to the fifth node.

25. The transmission circuit according to claim 22, wherein the first and second transmit transistors of the transmitter match the first and second transistors of the pre-driver.

26. The transmission circuit according to claim 22, wherein the third and fourth transmit transistors of the transmitter match the third and fourth transistors of the pre-driver.

* * * * *